US012352793B2

(12) United States Patent
Sud et al.

(10) Patent No.: US 12,352,793 B2
(45) Date of Patent: *Jul. 8, 2025

(54) FRACTIONAL FOURIER TRANSFORM-BASED SPECTRUM ANALYZER

(71) Applicant: The Aerospace Corporation, El Segundo, CA (US)

(72) Inventors: Seema Sud, Reston, VA (US); Timothy Jones, Purcellville, VA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/336,141

(22) Filed: Jun. 16, 2023

(65) Prior Publication Data

US 2023/0333149 A1    Oct. 19, 2023

Related U.S. Application Data

(63) Continuation of application No. 16/739,187, filed on Jan. 10, 2020, now Pat. No. 11,726,119.

(51) Int. Cl.
*G01R 23/165* (2006.01)
*G06F 17/14* (2006.01)
(Continued)

(52) U.S. Cl.
CPC ......... *G01R 23/165* (2013.01); *G06F 17/141* (2013.01); *H03H 17/0213* (2013.01); *H04B 1/1027* (2013.01)

(58) Field of Classification Search
CPC ........... H03H 17/0263; H03H 17/0213; G01R 23/165
See application file for complete search history.

(56) References Cited

U.S. PATENT DOCUMENTS 8,824,272 B2    9/2014 Sud
9,804,999 B2    10/2017 Sud
(Continued)

FOREIGN PATENT DOCUMENTS

CN    101212259 A  *  7/2008

OTHER PUBLICATIONS

Cagatay Candan et al., "The Discrete Fractional Fourier Transform," 1999 IEEE International Conference on Acoustics, Speech, and Signal Processing, Proceedings ICASSP99 (Cat. No.99CH36258), Phoenix, AZ, pp. 1713-1716 (Mar. 15-19, 1999).

(Continued)

*Primary Examiner* — Lam S Nguyen
(74) *Attorney, Agent, or Firm* — LeonardPatel PC (57) ABSTRACT

Fractional Fourier Transform (FrFT)-based spectrum analyzers and spectrum analysis techniques are disclosed. Rather than using the standard Fast Fourier Transform (FFT), the FrFT may be used to view the signal content contained in a particular bandwidth. Usage of the FrFT in place of the frequency or time domain allows viewing of the signal in different dimensions, where "spectral" features of interest, or signal content, may appear where they were not visible in these domains before. This may allow signals to be identified and viewed in any domain within the continuous time-frequency plane, and may significantly enhance the ability to detect and extract signals that were previously hidden under interference and/or noise, provide or enhance the ability to extract signals from a congested environment, and enable operation in a signal-dense environment.

18 Claims, 6 Drawing Sheets

(51) Int. Cl.
   *H03H 17/02*   (2006.01)
   *H04B 1/10*   (2006.01)

(56)   References Cited

U.S. PATENT DOCUMENTS

| | | | |
|---|---|---|---|
| 10,180,495 B2 | 1/2019 | Sud | |
| 10,437,664 B2 | 10/2019 | Sud | |
| 2008/0024207 A1* | 1/2008 | Baker | ................ H03H 17/0263 327/552 |

OTHER PUBLICATIONS

Cagatay Candan et al., "The Discrete Fractional Fourier Transform," IEEE Transactions on Signal Processing, vol. 48, No. 5, pp. 1329-1337 (May 2000).

Lam S Nguyen, "Non-Final Office Action", issued Nov. 15, 2022, U.S. Appl. No. 16/739,187.

Lam S Nguyen, "Notice of Allowance", issued Mar. 23, 2023, U.S. Appl. No. 16/739,187.

Lam S Nguyen, "Restriction Requirement", issued Aug. 11, 2022, U.S. Appl. No. 16/739,187.

Seema Sud, "A Simple Method for Separating Weak and Strong Moving Targets in Clutter for a Radar System using the Fractional Fourier Transform," Signal processing: an International Journal (SPIJ), vol. 10, No. 3, pp. 31-40 (2016).

\* cited by examiner

FRACTIONAL FOURIER TRANSFORM-BASED SPECTRUM ANALYZER

CROSS-REFERENCE TO RELATED APPLICATION

This application is a continuation of, and claims priority to, U.S. patent application Ser. No. 16/739,187 filed on Jan. 10, 2020. The subject matter thereof is hereby incorporated herein by reference in its entirety.

FIELD

The present invention generally pertains to signal analysis, and more specifically, to Fractional Fourier Transform (FrFT)-based spectrum analyzers and spectrum analysis techniques.

BACKGROUND

The FrFT has a wide range of applications in fields such as optics, quantum mechanics, image processing, and communications. The FrFT of a function $f(x)$ of order a is defined as:

$$F^a[f(x)] = \int_{-\infty}^{\infty} B_a(x,x') f(x') dx' \quad (1)$$

where the kernel $B_a(x, x')$ is defined as:

$$B_a(x, x') = \frac{e^{i(\pi\hat{\phi}/4 - \phi/2)}}{|\sin(\phi)|^{1/2}} \times e^{i\pi(x^2 \cot(\phi) - 2xx' \csc(\phi) + x'^2 \cot(\phi))} \quad (2)$$

where $\phi = a\pi/2$ and $\hat{\phi} = \text{sgn}[\sin(\phi)]$. This applies to the range $0 < |\phi| < \pi$, or $0 < |a| < 2$. In discrete time, the N×1 FrFT of an N×1 vector x can be modeled as:

$$X_a = F^a x \quad (3)$$

where $F^a$ is an N×N matrix whose elements are given by:

$$F^a[m, n] = \sum_{k=0, k \neq (N-1+(N)_2)}^{N} u_k[m] e^{-j\frac{\pi}{2} ka} u_k[n] \quad (4)$$

and where $u_k[m]$ and $u_k[n]$ are the eigenvectors of the matrix S defined by:

$$S = \begin{pmatrix} C_0 & 1 & 0 & \cdots & 1 \\ 1 & C_1 & 1 & \cdots & 0 \\ 0 & 1 & C_2 & \cdots & 0 \\ \vdots & \vdots & \vdots & \ddots & \vdots \\ 1 & 0 & 0 & \cdots & C_{N-1} \end{pmatrix} \quad (5)$$

and $$C_n = 2\cos\left(\frac{2\pi}{N} n\right) - 4 \quad (6)$$

The FrFT is a useful approach for separating a signal-of-interest (SOI) from interference and/or noise when the statistics of either are non-stationary (i.e., at least one device is moving, Doppler shift occurs, time-varying signals exist, there are drifting frequencies, etc.). The FrFT enables translation of the received signal to an axis in the time-frequency plane where the SOI and interference/noise are not separable in the frequency domain, as produced by a conventional Fast Fourier Transform (FFT), or in the time domain. Various algorithms for estimating the best rotational parameter a and applications using FrFTs have been developed.

Signal separation using the FrFT can be visualized using the concept of a Wigner Distribution (WD). The WD is a time-frequency representation of a signal. The WD may be viewed as a generalization of the Fourier Transform, which is solely the frequency representation. The WD of a signal $x(t)$ can be written as:

$$W_x(t,f) = \int_{-\infty}^{\infty} (t+\tau/2) x^*(t-\tau/2) e^{-2\pi j \tau f} d\tau \quad (7)$$

The projection of the WD of a signal $x(t)$ onto an axis $t_a$ gives the energy of the signal in the FrFT domain a, $|X_a(t)|^2$. Letting $\alpha = a\pi/2$, this may be written as:

$$|X_a(t)|^2 = \int_{-\infty}^{\infty} W_x(t\cos(\alpha) - f\sin(\alpha), t\sin(\alpha) + f\cos(\alpha)) \, df \quad (8)$$

In discrete time, the WD of a signal $x[n]$ can be written as:

$$W_x\left[\frac{n}{2f_s}, \frac{kf_s}{2N}\right] = e^{j\frac{\pi}{N}kn} \sum_{m=l_1}^{l_2} x[m] x^*[n-m] e^{j\frac{2\pi}{N}km} \quad (9)$$

where $l_1 = \max(0, n-(N-1))$ and $l_2 = \min(n, N-1)$. This particular implementation of the discrete WD is valid for non-periodic signals. Aliasing is avoided by oversampling the signal $x[n]$ using a sampling rate $fS$ (samples per second) that is at least twice the Nyquist rate.

The WD of an SOI and interference illustrates the benefit of filtering with the FrFT. See graph 100 of FIG. 1. In non-stationary environments, the SOI $x(t)$ and interference $x_I(t)$ vary as a function of time and frequency. The channel will also vary similarly. The two signals overlap in the time domain ($t_{a=0}$) and in the frequency domain ($t_{a=1}$), so they cannot be completely separated using either of these axes. This means that conventional time-based and frequency-based techniques, such as MMSE filtering and FFT analysis, respectively, will not achieve good signal separation. The FrFT can be used to seek the axes where the signals overlap the least, and hence can best be separated.

Figure 1:
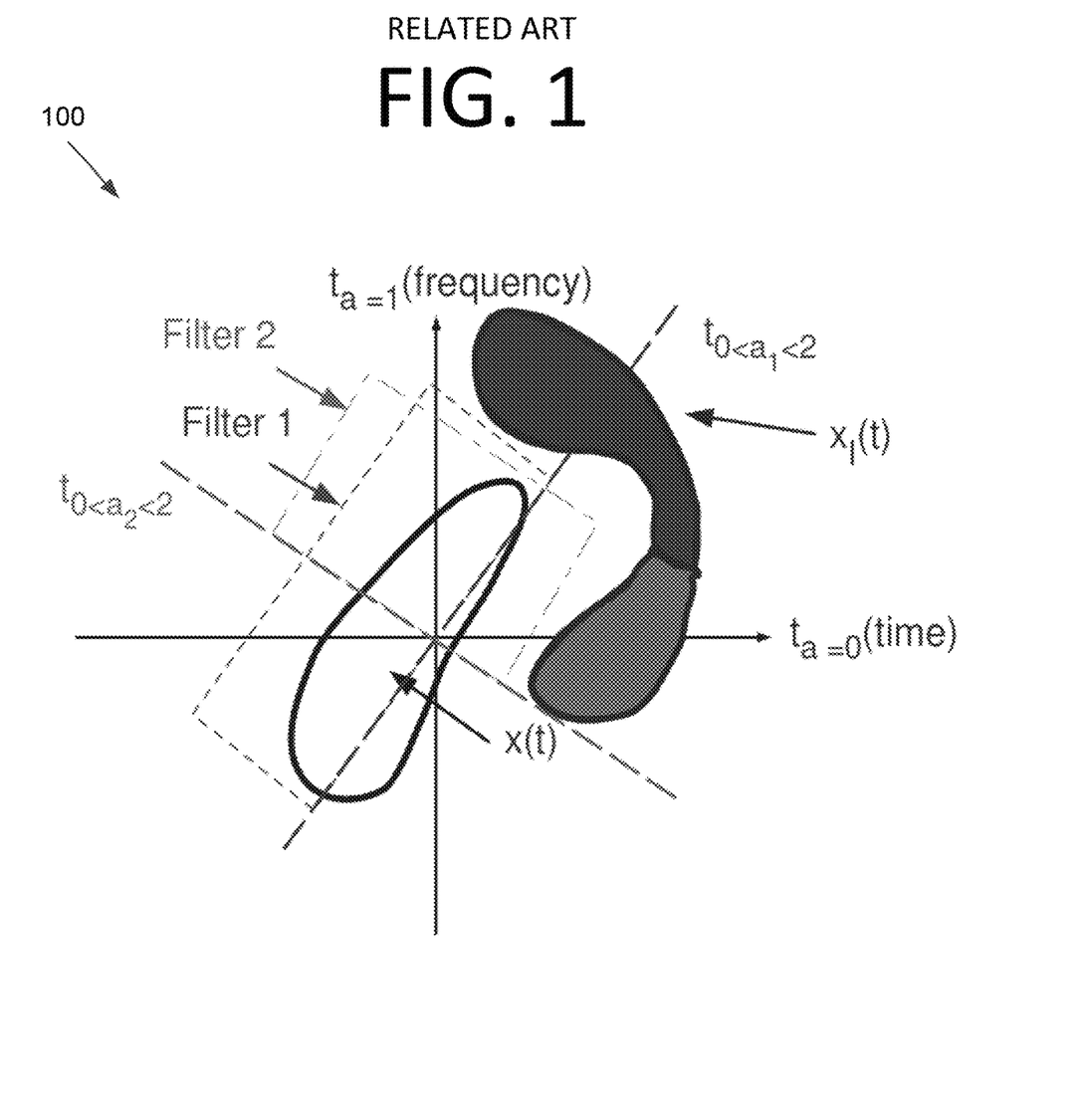
FIG. 1 is a graph illustrating a Wigner Distribution (WD) of signal x(t) and interference $x_I(t)$ with optimum axes $t_{a_1}$ and $t_{a_2}$ for filtering out interference.

Repeated FrFT domain filtering can improve separation capability even further. In FIG. 1, two rotations are required to completely filter out the interference. First, rotate to $a_1$, $0 < a_1 < 2$, to filter out the upper portion of the interfering signal $x_I(t)$ using filter 1 with filter 2, and then rotate to $a_2$, $0 < a_2 < 2$, to filter out the remaining lower part of $x_I(t)$. In Sud, S., "Interference Cancellation by Repeated Filtering in the Fractional Fourier Transform Domain Using Mean-Square Error Convergence", Int. Journal of Engineering Research and Applications (IJERA), Vol. 6, No. 5, Part-2, pp. 43-47 (May 2016), the optimum rotational axes are found by searching, using an MMSE criterion, which resulted in improvement in mean-square error (MSE) over the single stage filter.

Current spectrum analyzers, such as those provided by Tektronix® and Rohde & Schwarz®, only allow the RF spectrum to be viewed and processed in the frequency domain or the time domain. This only provides a single "snapshot" into the structure and spectral content. Weak signals are often difficult or impossible to detect and identify, and spectral space is also limited in just the frequency domain, making open "space" difficult to identify. Furthermore, such spectrum analyzers cannot detect all signals, cannot identify signal types or features, cannot separate signals, and require significant processing resources.

Previous approaches, such as those described in Sud (U.S. Pat. No. 10,437,664), search for signals with a known sequence of bits (i.e., using training data), search in different domains using FrFT, and extract SOIs. However, unknown signals are not identified. Accordingly, an improved spectrum analyzer and spectrum analysis approach may be beneficial.

SUMMARY

Certain embodiments of the present invention may be implemented and provide solutions to the problems and needs in the art that have not yet been fully solved by conventional signal analysis approaches and systems. For example, some embodiments of the present invention pertain to FrFT-based spectrum analyzers and spectrum analysis techniques.

In an embodiment, a method for performing FrFT-based spectrum analysis includes receiving RF signals for a portion of an RF spectrum at a sampling rate $f_S$, by a receiver. The method also includes collecting a block of M samples from the received RF signals, by a spectrum analyzer, and applying the FrFT to the block of M samples, by the spectrum analyzer, to rotate axes for a time domain and a frequency domain by an initial rotational parameter a, producing a rotated portion of the RF spectrum. The method further includes, when present above the noise floor, displaying one or more signals in the rotated portion of the RF spectrum for the time domain and the frequency domain when rotated by the initial rotational parameter a, by a display.

In another embodiment, a method for performing FrFT-based spectrum analysis includes applying the FrFT to a block of M samples, by a spectrum analyzer, to rotate axes for a time domain and a frequency domain by an initial rotational parameter a, producing a rotated portion of an RF spectrum. The method also includes, when present above the noise floor, displaying one or more signals in the rotated portion of the RF spectrum for the time domain and the frequency domain when rotated by the initial rotational parameter a, by a display.

In yet another embodiment, a method for performing FrFT-based spectrum analysis includes applying the FrFT to a block of M samples, by a spectrum analyzer, to rotate axes for a time domain and a frequency domain by an initial rotational parameter a, producing a rotated portion of an RF spectrum. The method also includes, when present above the noise floor, displaying one or more signals in the rotated portion of the RF spectrum for the time domain and the frequency domain when rotated by the initial rotational parameter a, by a display. The method further includes incrementing a by an amount $\Delta a$, by the spectrum analyzer, performing the FrFT on the block of M samples, by the spectrum analyzer, for the incremented a, and when present above the noise floor, displaying the one or more signals in the rotated portion of the RF spectrum for the time domain and the frequency domain when rotated by the incremented a, by the display. Additionally, the method includes repeating the incrementing of a by $\Delta a$, performing the FrFT for the incremented a, and, when present above the noise floor, displaying the one or more signals in the rotated portion of the RF spectrum for the time domain and the frequency domain when rotated by the incremented a until the one or more signals are detected above the noise floor or the incremented a equals a final value of a.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments of the present invention pertain to FrFT-based spectrum analyzers and spectrum analysis techniques. Rather than using the standard Fast Fourier Transform (FFT), some embodiments use the FrFT to view the signal content contained in a particular bandwidth. Usage of the FrFT in place of the frequency or time domain allows viewing of the signal in different dimensions, where "spectral" features of interest, or signal content, may appear where they were not visible in these domains before. Such embodiments may allow signals to be identified and viewed in any domain within the continuous time-frequency plane, and may significantly enhance the ability to detect and extract signals that were previously hidden under interference and/or noise, provide or enhance the ability to extract signals from a congested environment, and enable operation in a signal-dense environment.

Some embodiments have various advantages including, but not limited to: (1) allowing signals to be viewed in many more dimensions, enabling detection of signals that could not be previously seen; (2) aiding in the determination of the types of signals in the environment since certain types have defined features in FrFT domains that are not visible in the frequency or time domains; (3) enhancing signal separation capability by utilizing many more dimensions in which to possibly filter out signals; (4) enhancing the ability to transmit and receive in a complex, rapidly growing, congested RF environment; (5) aiding in the design of new transmission schemes by displaying open spots in the time-frequency plane in which to place new signals (conventional techniques are limited to the time or frequency space alone); (6) relaxing the number of samples required to process signals due to amplitude enhancement in the proper domain, along the new time axis $t_a$ (depending on the type of signals and how much noise is present; for instance, chirp signals have been observed where the number of samples required to detect the chirp was reduced from 1,024 to 64 once in the correct domain, which is a factor of 16 and more than an order of magnitude); (7) relaxing bandwidth requirements for filtering signals since filtering can be performed after the signal has been compressed by the rotation; (8) easing the sampling rate requirements to store and process the data following an inverse FrFT (IFrFT); and/or (9) operating in real-time by taking advantage of the fact that an FrFT computation can be performed with the same complexity as an FFT computation—while the FrFT appears to have additional complexity due to the FrFT being computed over a range of a, this can be mitigated by performing the computations in parallel and additional latency only comes from updating the spectrum analyzer display. While conventional spectrum analyzers also update their displays, choosing the value of a to display in some embodiments would require minimal additional latency.

With respect to relaxing the bandwidth requirements for filtering signals in (7), when rotation is performed, the signal is compressed in time or frequency. This causes the signal to shoot up in amplitude, enabling the signal to be seen above the noise floor. For example, a wideband chirp signal that is 4 MHz wide can compress into a single frequency tone (see, e.g., FIG. 2, where the chirp had a bandwidth of $f_2$-$f_1$ Hz, but the tone is one frequency). Thus, the bandwidth is reduced. In the case of the chirp, it becomes a tone with no bandwidth at all, so a relatively straightforward notch filter can remove or extract the chirp signal. For a general signal (see FIG. 3, for example) where the signal x(t) is relatively wide in time or frequency, when rotation to the axis $t_a$ is performed, the signal becomes narrower. Hence, the filter can also be narrower (as shown by filter 310 in FIG. 3).

With the growth in both satellite and terrestrial mobile communications, the RF environment is becoming increasingly dense and complex. FrFT-based spectrum analyzers may provide a tool that offers communications engineers and others interested in signal analysis with an improved way to operate in this increasingly dense and complex environment. FrFT-based spectrum analyzers may also enhance the ability to identify certain SOIs much more easily. For example, a radar chirp signal is spread out in frequency, and thus may not be readily visible on a traditional spectrum analyzer. However, in the right FrFT dimension (or relatively close thereto), the chirp becomes compressed to one sample in time, resulting in an amplitude increase that causes the chirp signal to appear above the noise floor. Hence, detection and subsequent extraction and processing are enabled and simplified since the chirp signal may not even be detectable via the FFT.

Figure 2:
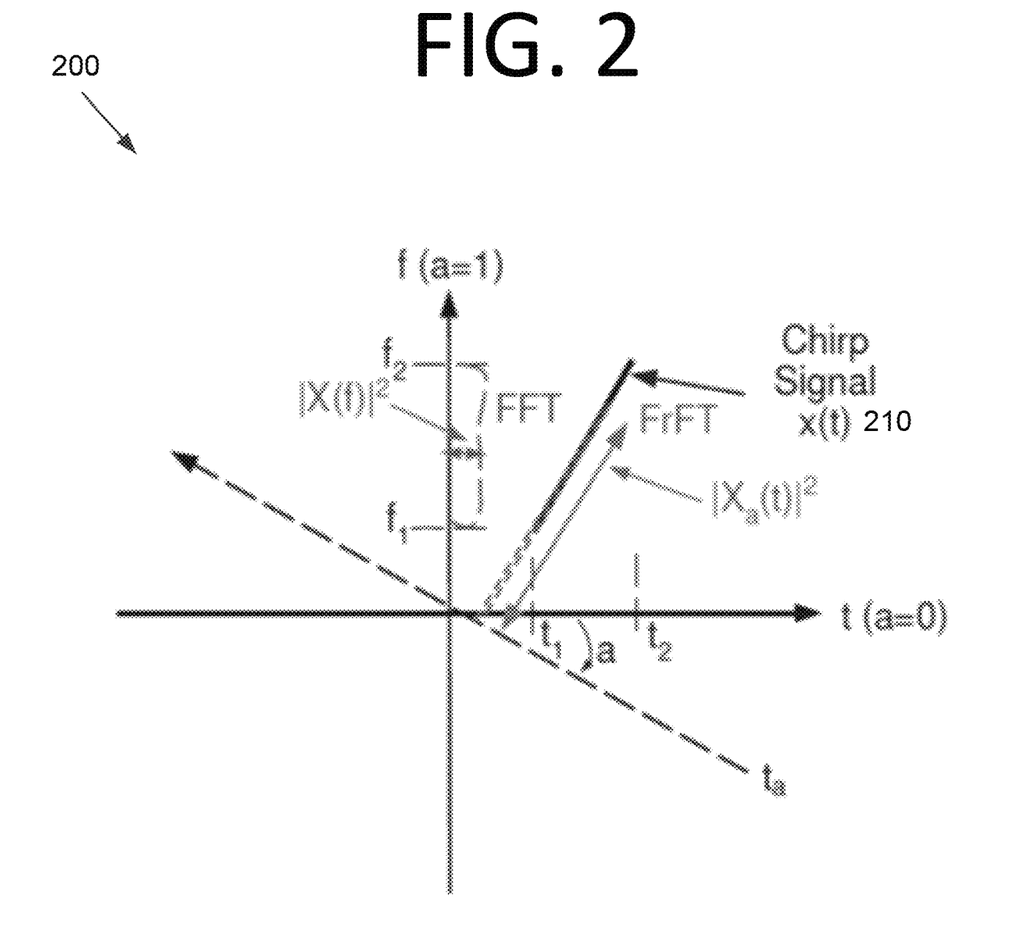
FIG. 2 is a graph illustrating a WD representation of a chirp signal x(t), according to an embodiment of the present invention.

FIG. 2 is a graph illustrating a WD representation of a chirp signal x(t), which could be a weak radar signal. Noise (not shown) would be spread out across the entire plane, as would interference, if present. In the frequency domain, the weak chirp signal energy is spread out from frequencies $f_1$ to $f_2$. At the right FrFT axis $t_a$, the chirp becomes a strong tone, concentrated in a single time sample. Thus, the chirp signal can be readily extracted or removed by a relatively narrow filter and stored for further analysis.

Some embodiments have various practical applications. For instance, FrFT-based spectrum analyzers of some embodiments could replace existing commercially available spectrum analyzers. This has applications for global positioning systems (GPS) and satellite systems monitoring interference.

Figure 3:
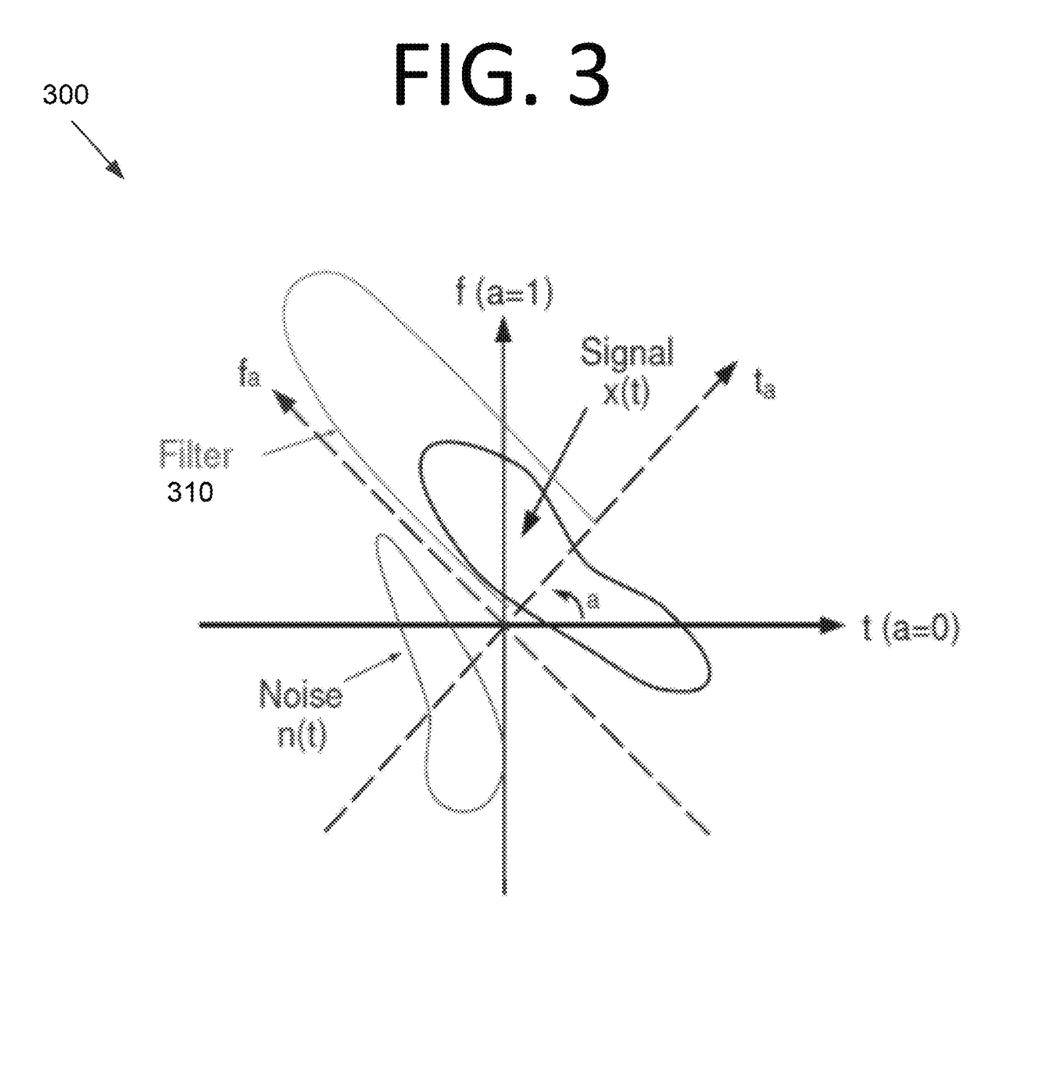
FIG. 3 is a graph illustrating a WD representation of a signal x(t) and noise n(t), according to an embodiment of the present invention.

FIG. 3 is a graph 300 illustrating a WD representation of a signal x(t) and noise n(t). A new time axis $t_a$ and corresponding new frequency axis $f_a$ may be selected where a signal is more easily viewed. The flexibility in the rotational axis allows a user to choose which axis provides the best separation between the signal and noise for better signal extraction (e.g., along the axis $t_a$ by filtering using filter 310). Conventional spectrum analyzer filters are limited to the frequency domain or the time domain only. Signals can be stored for further processing in the FrFT-based spectrum analyzer in some embodiments.

A signal may also be transmitted in the new domain defined by $t_a$ and $f_a$ to avoid detection, to avoid interference and/or noise, or both (i.e., to avoid detection and to avoid interference and/or noise). In the case of both, the signal may be transmitted along the part of the $t_a$ axis that has no signals. In FIG. 3, this may be the portion without signals proximate to the $f_a$ axis between the signal x(t) and the noise n(t).

Rather than looking for signals with a known sequence of bits (i.e., training data), searching in different domains using FrFT, and extracting SOIs, some embodiments collect signal data for a frequency range (e.g., 2 GHz to 4 GHz) that includes unknown signals. The FrFT may be applied to look for signals that begin to peak above a noise floor. Such signals can then be displayed to a user, stored for further analysis, filtered to look for other signals, etc.

The types of signals that are present may also be identified. For instance, a chirp signal may begin to appear as a rectangle coming out of the noise floor that becomes skinnier and taller. Various signals may not be visible in frequency or time alone, but these signals may pop out above different thresholds. These thresholds can be adjusted to detect signals of varying power levels and/or bandwidths.

In some embodiments, the display provides a WD that could show the energy in the rotated dimension; the magnitude of signal energy, the magnitude of signal energy squared (power), etc. In certain embodiments, data pertaining to discovered signals can be stored and processed later. For instance, the rotated frequency spectrum can be analyzed to determine what is there and where space may be found to insert new signals.

In some embodiments, "signatures" could be learned from identified signals, and the spectrum analyzer could then be trained and look for similarities in signals in other frequencies and domains. For instance, signals could have similar encoding structures (e.g., CDMA modulated spread), similar protocols, etc. Signals often use known training sequences (e.g., preambles) to assist the receiver with synchronization. These training sequences are signatures that could be applied along with rotated axes to help to identify and isolate the signal from interference and noise in some embodiments if it is suspected or known that the signal is present. This amounts to applying an adaptive filter to separate the signal from the interference and noise using the known training sequence, and also to finding the best rotated dimension for better separation.

Figure 4:
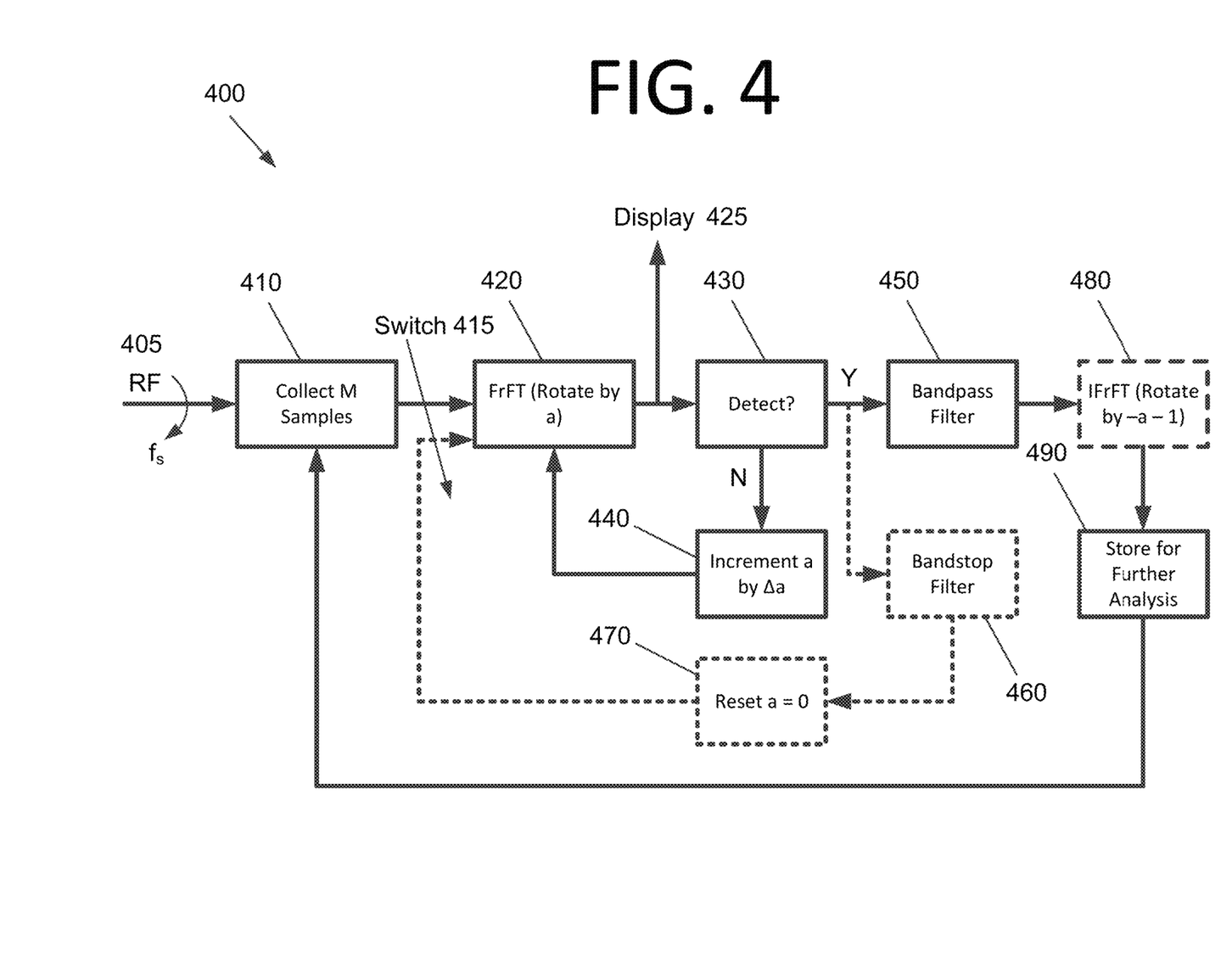
FIG. 4 is a block diagram illustrating a process for performing FrFT-based spectrum analysis by a spectrum analyzer, according to an embodiment of the present invention.

FIG. 4 is a block diagram 400 illustrating a process for performing FrFT-based spectrum analysis by a spectrum analyzer, according to an embodiment of the present invention. The process beings with receiving RF signals for a portion of the RF spectrum at 405. $f_S$ denotes the sampling rate of the receiver (e.g., in Hz). The sampling rate determines the amount of bandwidth that the receiver collects (e.g., collecting a 4 MHz bandwidth may require $f_S$ to be approximately equal to 8 MHz).

A block of M samples is then collected at 410. A switch 415 controls which signals to process. For instance, if switch 415 is in the top position, new blocks of M samples are collected. If switch 415 is in the bottom position, then the already processed block of M samples, which has been filtered to remove a particular signal by bandstop filter 460, is used. In other words, the bottom position processes a stripped portion of the spectrum after applying bandstop filter 460 to look for other, possibly weaker signals in the spectrum.

The FrFT is applied at 420 to rotate the axes by the rotational parameter a. The results of the rotated signal(s) and/or noise are displayed via display 425. Per the above, in some embodiments, this information may be displayed as a WD.

If a signal is not detected above a noise floor at 430 (i.e., the thermal noise seen by the receiver that comes from internal receiver components and external sources), a is incremented by an amount Δa at 440 (e.g., by 0.01 in a less cluttered signal environment and 0.001 in a more cluttered signal environment) and the FrFT is performed using this new value for a at 420. However, any suitable value for Δa (e.g., 0.1, 0.5, 0.00001, etc.) may be used without deviating from the scope of the invention. In some embodiments, the detection threshold may be set based on the noise floor. For instance, the threshold may initially be set to two or three times higher than the noise floor, but then reduced if signals are not observed. However, any desired threshold higher than the noise floor may be used without deviating from the scope of the invention. This setting may be user configurable in some embodiments.

In certain embodiments, rather than using automatic increments, Δa may be supplied by a user (e.g., by turning a knob on a spectrum analyzer that controls the rotational parameter, entering a number manually, etc.). This process is repeated until a signal is detected above the noise floor at 430. The signal data is then passed through a bandpass filter at 450, which removes other signals except for those within a bandwidth of interest. The bandwidth of the filter may be chosen based on the signal(s) observed rising above the noise floor on the rotated spectrum. Additionally or alternatively, a bandstop filter 460 may be applied that removes the discovered signal so other, weaker signals can be sought. The rotational parameter a is then set to zero at 470 and the process returns to 420 using the data with the detected strongest signal removed. This may be repeated to identify and remove the second strongest signal, the third strongest signal, etc. In this manner, progressively weaker signals can be identified until signals are so weak that they do not appear above the noise floor even with the application of the FrFT.

In some embodiments, an IFrFT is performed at 480 to rotate back. This puts the signal back in the original frequency domain so the signal can be observed (if visible) in both the unrotated and rotated domains. The system can rotate back to the conventional time domain by rotating by $-a-1$. Each $t_a$ axis and $f_a$ axis in the WD plane is separated by a rotation of 1. For instance, conventional time is a=0 and conventional frequency is a=1, so to go from frequency to time, the system rotates by a=−1). However, in certain embodiments, the same rotational parameter may be used for the next M samples. The detected signal(s) are then stored at 490 for further analysis. For instance, the stored signals may be analyzed to determine their type(s) and characteristics for future signal identification purposes.

Figure 5:
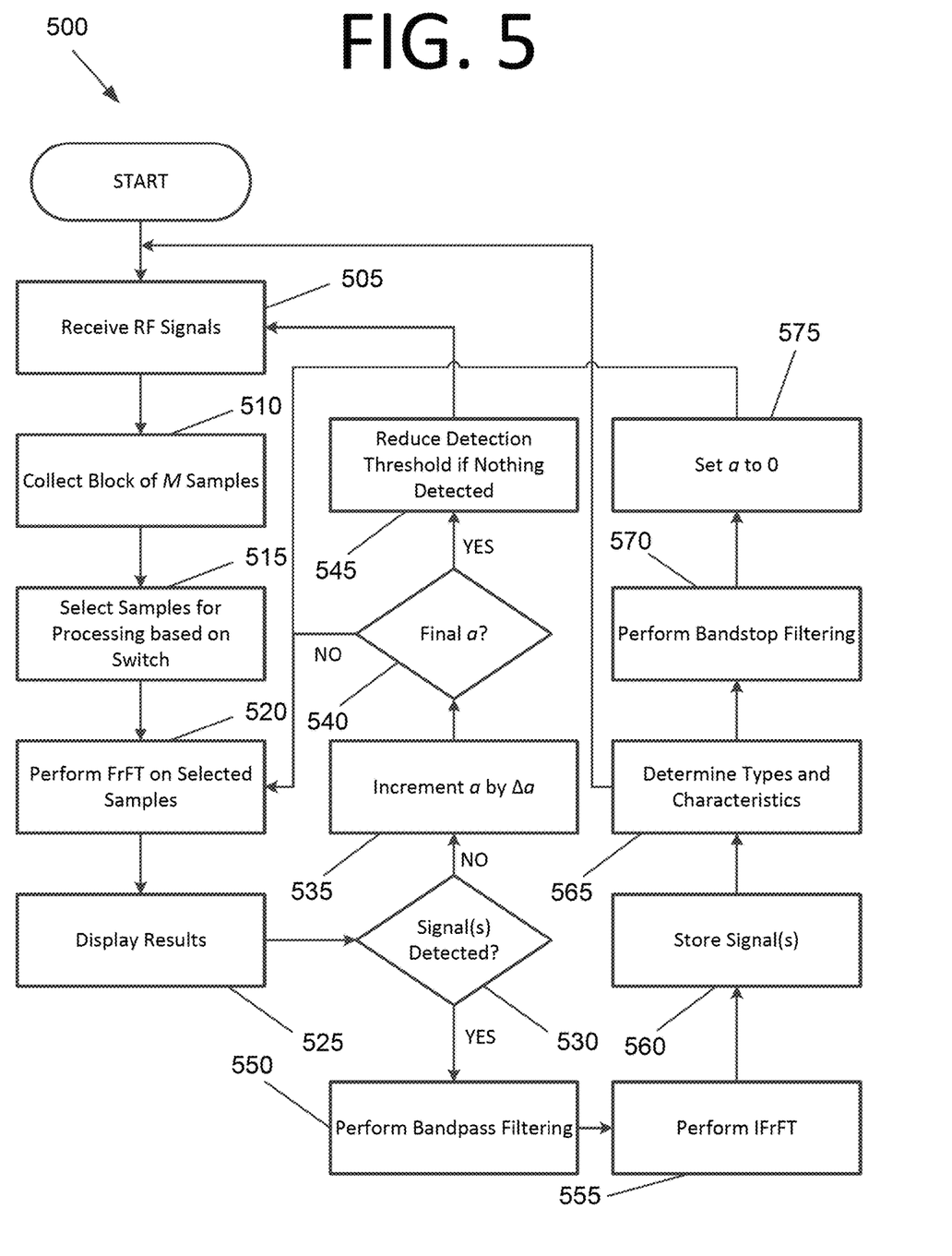
FIG. 5 is a flowchart illustrating a process for performing FrFT-based spectrum analysis, according to an embodiment of the present invention.

FIG. 5 is a flowchart illustrating a process for performing FrFT-based spectrum analysis, according to an embodiment of the present invention. The process begins with receiving RF signals for a portion of the RF spectrum at a sampling rate fs at 505. In some embodiments, $f_S$ is at least two times a frequency of the portion of the RF spectrum. A block of M samples is collected from the received RF signals at 510.

A switch may control which samples to process at 515. For instance, the switch may determine whether to process a block of M samples after bandstop filtering or a new block of M samples. See, for example, switch 415 of FIG. 4. The FrFT is then applied to the selected block of M samples at 520 to rotate axes for the time domain and the frequency domain by an initial rotational parameter a, producing a rotated portion of the RF spectrum. In some embodiments, this may include setting an initial detection threshold for detecting the one or more signals above the noise floor to two or three times higher than the noise floor if it is the first pass through. The noise and, when present above the noise floor, one or more signals in the rotated portion of the RF spectrum for the time domain and the frequency domain when rotated by the initial rotational parameter a are then displayed at 525. In some embodiments, the noise, the one or more signals, or both, are displayed as a WD.

When one or more signals are not detected above the noise floor for the initial value of a at 530, a is incremented by Δa at 535. In some embodiments, Δa is between 0.01 and 0.001. In certain embodiments, Δa is supplied by a user via controls of a spectrum analyzer. If the incremented a equals the final value of a (i.e., 2) at 540, the process returns to step 505. However, if not, the detection threshold may be reduced at 545 if nothing was detected and the process returns to step 520 using the incremented a for the FrFT.

When one or more signals are detected above the noise floor at 530, the M samples are passed through a bandpass filter that removes other signals outside a bandpass filtering bandwidth at 550. In some embodiments, the bandpass filtering bandwidth is selected based on a bandwidth of the one or more signals rising over the noise floor on the rotated spectrum. An inverse FrFT is performed at 555 to rotate back to the initial a, and the filtered signal(s) are stored at 560. In some embodiments, the types and characteristics of the stored signal(s) are determined at 565 for future signal identification purposes, and the process may return to step 505. Alternatively, the M samples may be passed through a bandstop filter that removes the one or more signals rising above the noise floor at 570. a is then set to 0 at 575, and the process may return to step 520 using the filtered set of samples to look for weaker signals.

Figure 6:
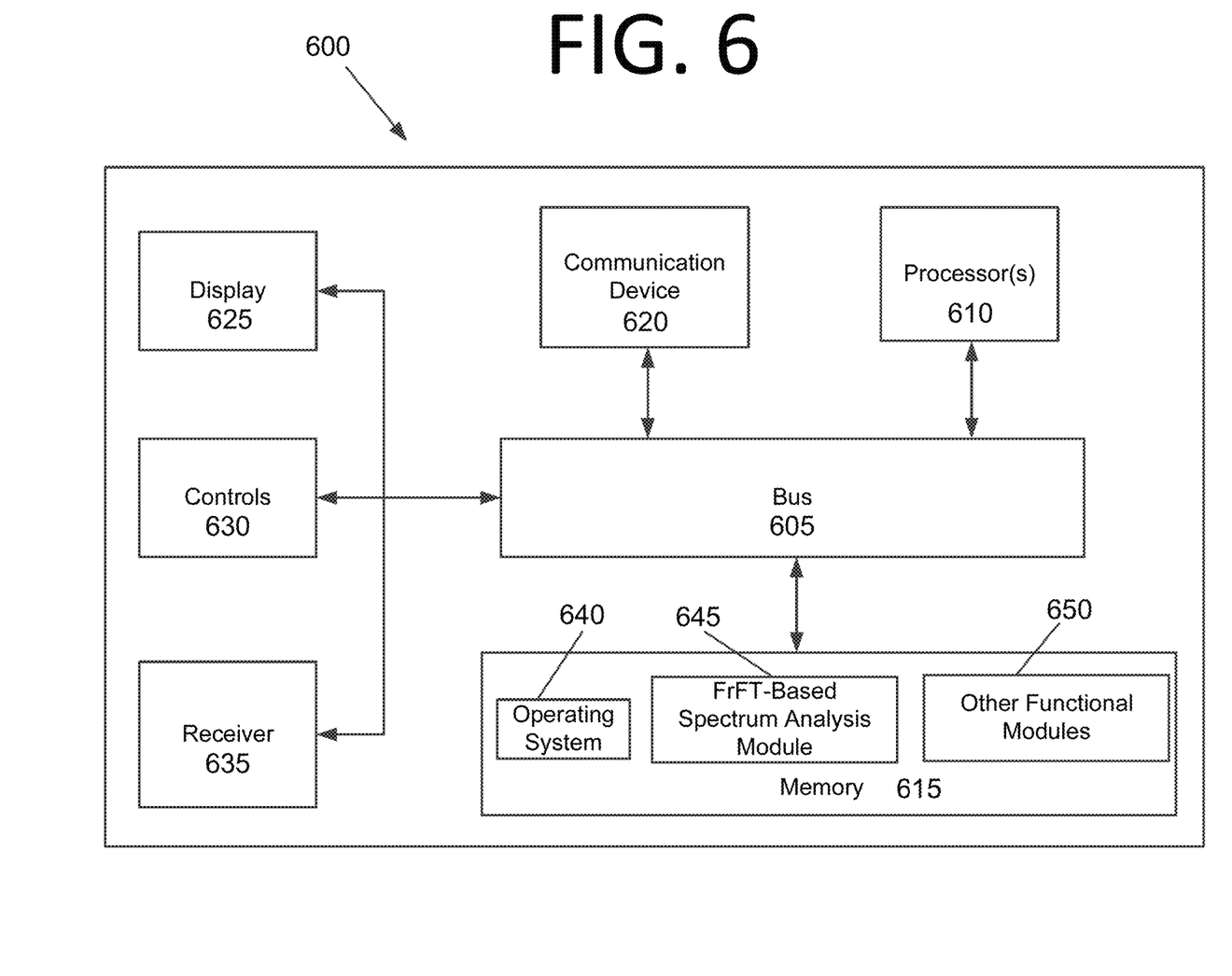
FIG. 6 is a block diagram illustrating a spectrum analyzer configured to perform FrFT-based spectrum analysis, according to an embodiment of the present invention.

FIG. 6 is a block diagram illustrating a spectrum analyzer 600 configured to perform FrFT-based spectrum analysis, according to an embodiment of the present invention. Spectrum analyzer 600 includes a bus 605 or other communication mechanism for communicating information, and processor(s) 610 coupled to bus 605 for processing information. Processor(s) 610 may be any type of general or specific purpose processor, including a central processing unit (CPU), an application specific integrated circuit (ASIC), a field programmable gate array (FPGA), etc. Processor(s) 610 may also have multiple processing cores, and at least some of the cores may be configured for specific functions. Spectrum analyzer 600 further includes memory 615 for storing information and instructions to be executed by processor(s) 610. Memory 615 can be comprised of any combination of random access memory (RAM), read only memory (ROM), flash memory, cache, static storage such as a magnetic or optical disk, or any other types of non-transitory computer-readable media or combinations thereof. The non-transitory computer-readable media may be any available media that can be accessed by processor(s) 610 and may include volatile and/or non-volatile media. The non-transitory computer-readable media may be removable and/or non-removable. Additionally, spectrum analyzer 600 includes a communication device 620, such as a transceiver, that is configured to provide access to, and communicate over, a communications network. However, communication device 620 may not be present in some embodiments.

Processor(s) 610 are further coupled via bus 605 to a display 625, such as a Liquid Crystal Display (LCD), for displaying signal information to a user (e.g., via a WD). In some embodiments, display 625 may not be included, and spectrum analyzer may send data to a separate computing system (e.g., a desktop computer, a laptop, a mobile device, etc.) for display. Controls 630 allow the user to select/change input parameters, such as selecting a frequency range, changing the rotational parameter a, storing a signal, removing a signal from the samples, changing the thresholds, changing the block sizes M, changing the sampling rate, etc. Controls may include, but are not limited to, a keypad, control knobs, buttons, etc. A receiver 635 receives RF signals to be analyzed by spectrum analyzer 600.

Memory 615 stores software modules that provide functionality when executed by processor(s) 610. The modules include an operating system 640 for spectrum analyzer 600. The modules further include an FrFT-based spectrum analysis module 645 that is configured to configured to perform part or all of the functionality discussed herein. Spectrum analyzer 600 may also include one or more additional functional modules 650 that include additional functionality.

It should be noted that some of the system features described in this specification have been presented as modules, in order to more particularly emphasize their implementation independence. For example, a module may be implemented as a hardware circuit comprising custom very large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, RAM, tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The process steps performed in FIGS. 5 and 6 may be performed by a computer program, encoding instructions for a spectrum analyzer to perform at least the process(es) described in FIGS. 5 and 6, in accordance with embodiments of the present invention. The computer program may be embodied on a non-transitory computer-readable medium. The computer-readable medium may be, but is not limited to, a hard disk drive, a flash device, RAM, a tape, or any other such medium used to store data. The computer program may include encoded instructions for controlling the spectrum analyzer to implement the process(es) described in FIGS. 5 and 6, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general-purpose computer, or an ASIC.

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method for performing fractional Fourier transform (FrFT)-based spectrum analysis, comprising:
   setting an initial detection threshold for detecting one or more signals above a noise floor to a value higher than the noise floor, by a spectrum analyzer, the initial detection threshold set to a value higher than the noise floor;
   applying the FrFT to a block of M samples in radio frequency (RF) signals, by a spectrum analyzer, to rotate axes for a time domain and a frequency domain by a plurality of values of a rotational parameter a, thereby producing one or more rotated portions of the RF spectrum; and
   responsive to detecting that the one or more signals are present above the noise floor in the block of M samples and above the initial detection threshold:
      storing the one or more detected signals above the noise floor, by the spectrum analyzer,
      determining types and characteristics of the one or more stored signals for future signal identification purposes,
      performing filtering to remove the one or more signals rising above the noise floor from the block of M samples, and
      repeating the application of the FrFT to the filtered block of M samples, taking into account the determined types and characteristics of the one or more stored signals, by the spectrum analyzer.

2. The method of claim 1, wherein a bandwidth for the bandpass filtering is selected based on a bandwidth of the one or more detected signals rising above the noise floor.

3. The method of claim 1, wherein
   the plurality of values of a are separated from one another by an increment of $\Delta a$, and
   the FrFT is performed for each of the plurality of values of a until a final value of a is reached or the one or more signals are detected above the noise floor.

4. The method of claim 1, wherein the repeating of the application of the FrFT to the filtered block of M samples comprises performing an inverse FrFT, by the spectrum analyzer, to rotate back to an initial value of a.

5. The method of claim 1, further comprising:
   reducing the detection threshold, by the spectrum analyzer, responsive to not detecting the one or more signals above the noise floor at the initial detection threshold and repeating the method of claim 1 until the one or more signals are detected or the detection threshold reaches the noise floor.

6. The method of claim 1, further comprising:
   responsive to detecting that the one or more signals are present above the noise floor in the block of M samples, displaying the one or more detected signals, by a display.

7. A method for performing fractional Fourier transform (FrFT)-based spectrum analysis, comprising:
   applying the FrFT to a block of M samples, by a spectrum analyzer, to rotate axes for a time domain and a frequency domain by an initial rotational parameter a, producing a rotated portion of a radio frequency (RF) spectrum;
   responsive to detecting one or more signals above a noise floor for the initial a, performing filtering to remove the one or more signals rising above the noise floor from the block of M samples; and
   responsive to not detecting the one or more signals above the noise floor for the initial a:
      incrementing a by an amount $\Delta a$, by the spectrum analyzer,
      performing the FrFT on the block of M samples, by the spectrum analyzer, for the incremented a, and
      repeating the process of performing filtering responsive to detecting the one or more signals above the noise floor or incrementing a responsive to not detecting the one or more signals above the noise floor until a final value of a is processed.

8. The method of claim 7, wherein a bandwidth for the bandpass filtering is selected based on a bandwidth of the one or more detected signals rising above the noise floor.

9. The method of claim 7, wherein after the final value of a is processed, the method further comprises:
   performing an inverse FrFT, by the spectrum analyzer, to rotate back to the initial value of a; and
   repeating the method of claim 7 on the processed block of M samples beginning with the initial value of a.

10. The method of claim 7, further comprising:
    storing the one or more detected signals above the noise floor, by the spectrum analyzer; and
    determining types and characteristics of the one or more stored signals for future signal identification purposes.

11. The method of claim 7, further comprising:
    setting an initial detection threshold for detecting the one or more signals above the noise floor to a value higher than the noise floor, by the spectrum analyzer.

12. The method of claim 11, further comprising:
    reducing the detection threshold, by the spectrum analyzer, when the one or more signals above the noise floor are not detected at the initial detection threshold and repeating the method of claim 9 until the one or more signals are detected or the detection threshold reaches the noise floor.

13. The method of claim 7, further comprising:
    responsive to detecting that the one or more signals are present above the noise floor in the block of M samples, displaying the one or more detected signals in the rotated portion of the RF spectrum for the time domain and the frequency domain for the respective value of a, by a display.

14. A method for performing fractional Fourier transform (FrFT)-based spectrum analysis, comprising:
    setting an initial detection threshold for detecting the one or more signals above the noise floor to a value higher than the noise floor, by the spectrum analyzer;
    applying the FrFT to a block of M samples, by a spectrum analyzer, to rotate axes for a time domain and a frequency domain by an initial rotational parameter a, producing a rotated portion of a radio frequency (RF) spectrum;
    responsive to detecting one or more signals above a noise floor for the initial a, performing filtering to remove the one or more signals rising above the noise floor from the block of M samples;
    responsive to not detecting the one or more signals above the noise floor for the initial a:
       incrementing a by an amount $\Delta a$, by the spectrum analyzer,
       performing the FrFT on the block of M samples, by the spectrum analyzer, for the incremented a, and
       repeating the process of performing filtering responsive to detecting the one or more signals above the noise floor or incrementing a responsive to not detecting the one or more signals above the noise floor until a final value of a is processed; and reducing the detection threshold, by the spectrum analyzer, responsive to not detecting the one or more signals above the noise floor at the initial detection threshold and repeating the signal analysis until the one or more signals are detected or the detection threshold reaches the noise floor.

15. The method of claim 14, wherein a bandwidth for the bandpass filtering is selected based on a bandwidth of the one or more detected signals rising above the noise floor.

16. The method of claim 14, wherein after the final value of a is processed, the method further comprises:

performing an inverse FrFT, by the spectrum analyzer, to rotate back to the initial value of a; and repeating the method of claim 14 on the processed block of M samples beginning with the initial value of a.

17. The method of claim 14, further comprising:

storing the one or more detected signals above the noise floor, by the spectrum analyzer; and determining types and characteristics of the one or more stored signals for future signal identification purposes.

18. The method of claim 14, further comprising:

responsive to detecting that the one or more signals are present above the noise floor in the block of M samples, displaying the one or more detected signals in the rotated portion of the RF spectrum for the time domain and the frequency domain for the respective value of a, by a display.

* * * * *